(12) United States Patent
Kakadia et al.

(10) Patent No.: US 9,811,622 B2
(45) Date of Patent: Nov. 7, 2017

(54) OPTIMIZED NETWORK NODE SELECTION

(75) Inventors: Deepak Kakadia, Union City, CA (US); Jay J. Lee, San Ramon, CA (US); Thomas Tan, San Jose, CA (US)

(73) Assignee: Verizon Patent and Licensing Inc., Basking Ridge, NJ (US)

( * ) Notice: Subject to any disclaimer, the term of this patent is extended or adjusted under 35 U.S.C. 154(b) by 483 days.

(21) Appl. No.: 13/276,734

(22) Filed: Oct. 19, 2011

(65) Prior Publication Data

US 2013/0100815 A1     Apr. 25, 2013

(51) Int. Cl.
    *H04L 12/28*      (2006.01)
    *G06F 17/50*      (2006.01)
    *H04W 40/00*      (2009.01)
    *H04L 12/721*     (2013.01)

(52) U.S. Cl.
     CPC ........ *G06F 17/5068* (2013.01); *H04L 45/124* (2013.01); *H04W 40/00* (2013.01)

(58) Field of Classification Search
     USPC ........................................ 370/236, 400, 401
     See application file for complete search history.

(56) References Cited

U.S. PATENT DOCUMENTS

| | | | |
|---|---|---|---|
| 2002/0186665 A1* | 12/2002 | Chaffee et al. | 370/255 |
| 2005/0036487 A1* | 2/2005 | Srikrishna | 370/389 |
| 2005/0105519 A1* | 5/2005 | Koppol | 370/386 |
| 2006/0291444 A1* | 12/2006 | Alvarez et al. | 370/351 |
| 2007/0038764 A1* | 2/2007 | Maillard | 709/229 |
| 2007/0214280 A1* | 9/2007 | Patel et al. | 709/239 |
| 2008/0043627 A1* | 2/2008 | Singh et al. | 370/241 |
| 2008/0232258 A1* | 9/2008 | Larsson et al. | 370/238 |
| 2009/0296719 A1* | 12/2009 | Maier et al. | 370/400 |
| 2009/0323544 A1* | 12/2009 | Gaddis et al. | 370/252 |
| 2010/0220656 A1* | 9/2010 | Ramankutty et al. | 370/328 |
| 2010/0302973 A1* | 12/2010 | Lange et al. | 370/254 |
| 2011/0310864 A1* | 12/2011 | Gage | 370/338 |
| 2013/0121298 A1* | 5/2013 | Rune et al. | 370/329 |

* cited by examiner

*Primary Examiner* — Charles C Jiang
*Assistant Examiner* — Ryan Kavleski

(57) ABSTRACT

A device receives Internet protocol (IP) addresses and metrics associated with network nodes of a network, and stores the IP addresses and the metrics in a route table. The device receives, from a user equipment, a request to connect to the network, and determines a particular network node, of the network nodes, to which to forward a communication session of the user equipment, based on the request and based on the metrics stored in the route table. The device forwards the communication session of the user equipment to the particular network node, and the particular network node enables the user equipment to connect to the network.

20 Claims, 11 Drawing Sheets

OPTIMIZED NETWORK NODE SELECTION

BACKGROUND

As wireless network data rates improve using third generation (3G), fourth generation (4G), and WiFi technologies, more and more bandwidth-intensive applications are being developed. A 4G wireless network is an all Internet protocol (IP) wireless network in which different advanced multimedia application services (e.g., voice over IP (VoIP) content, video content, etc.) are delivered over IP. 4G wireless networks include a radio access network (e.g., a long term evolution (LTE) network or an enhanced high rate packet data (eHRPD) network) and a wireless core network (e.g., referred to as an evolved packet core (EPC) network). The LTE network is often called an evolved universal terrestrial radio access network (E-UTRAN). The EPC network is an all-IP packet-switched core network that supports high-speed wireless and wireline broadband access technologies. An evolved packet system (EPS) is defined to include the LTE (or eHRPD) network and the EPC network.

A typical LTE network includes an eNodeB (eNB), a mobility management entity (MME), a serving gateway (SGW), and a packet data network (PDN) gateway (PGW). The current method for selecting a MME, SGW, and PGW for a particular eNB includes hard coding associations based on tracking area codes (TACs) assigned by wireless operators across all geographies and based on access point name (APN).

User equipment (UE) may connect to an appropriate eNB in a LTE network based on signal strength. The eNB forwards a request to the MME to select a SGW and a PGW, as well as a backup SGW and a backup PGW, based on querying a domain name system (DNS) that is manually configured with static mappings. The static mappings associate a TAC to the SGW and the MME, and associate an APN to the PGW. The MME obtains the TAC and the APN from a UE attach message, and uses this information to query the DNS. A minimum of two DNS queries must be performed. The first query obtains name authority pointer (NAPTR) records of correct SGWs, and the second query obtains the associated IP addresses of the SGWs. If any changes occur, these DNS entries must be manually configured and updated, which causes latency and load conditions on the DNS. The MME may select a SGW from a list of SGWs returned by the DNS queries.

Once the SGW is selected, the MME may perform DNS queries to obtain a list of PGWs from which to select based on the APN in the UE attach message. Once the MME selects one of the PGWs from the list, the MME may perform DNS queries to obtain an IP address of the selected PGW. Selection of the PGW causes latencies due to the multiple DNS messages and responses, and causes processing load on the MME and the DNS.

After the SGW and the PGW are selected, the SGW and the PGW may begin processing bearer data traffic. If the SGW or the PGW fails while processing bearer data traffic, the only way for the MME to obtain knowledge of the failure is via timeouts that may be thirty seconds or more. This outage time may not be acceptable in many wireless operator networks, such as LTE networks.

DETAILED DESCRIPTION OF PREFERRED EMBODIMENTS

The following detailed description refers to the accompanying drawings. The same reference numbers in different drawings may identify the same or similar elements.

Systems and/or methods described herein may provide for optimized selection of network nodes, such as LTE network nodes (e.g., a MME, a SGW, a PGW, etc.), using an integrated control and data plane approach. The systems and/or methods may leverage features in routing protocols, such as the open shortest path first (OSPF) protocol, the intermediate system to intermediate system (IS-IS) protocol, and the enhanced interior gateway routing protocol (EI-GRP), that perform longest prefix matching and metrics to select optimal routes. Furthermore, the systems and/or methods may eliminate long latencies in the event of network node failures, may eliminate unequal load on network nodes, and may eliminate complex mappings and manual configurations. The systems and/or methods may automatically load balance among a pool of network nodes by incorporating factors related to load in routing metrics.

In one example implementation, the systems and/or methods may receive a request to connect to a network from a UE, and may receive advertised IP addresses and metrics of network nodes. The systems and/or methods may store the advertised IP addresses and the metrics in a route table, and may determine a particular network node to which to forward a communication session of the UE based on the metrics provided in the route table. The systems and/or methods may route the communication session of the UE to the particular network node, and the particular network node may enable the UE to connect to the network.

The term "metric," as used herein, is intended to be broadly construed to include a value that provides a network with an aggregated computed cost to reach a destination network node at a particular point in time. The computation of a metric may be configurable, and may be a measure of a load on the destination network node in terms of processor or memory load, congestion of a path to reach the destination network node, etc. At any point in time, network traffic may be forwarded to an optimal destination network node associated with a lowest metric value.

As used herein, the terms "subscriber" and/or "user" may be used interchangeably. Also, the terms "subscriber" and/or "user" are intended to be broadly interpreted to include a UE, or a user of a UE.

The term "component," as used herein, is intended to be broadly construed to include hardware (e.g., a processor, a microprocessor, an application-specific integrated circuit (ASIC), a field-programmable gate array (FPGA), a chip, a memory device (e.g., a read only memory (ROM), a random access memory (RAM), etc.), etc.) or a combination of hardware and software (e.g., a processor, microprocessor, ASIC, etc. executing software contained in a memory device).

Figure 1:
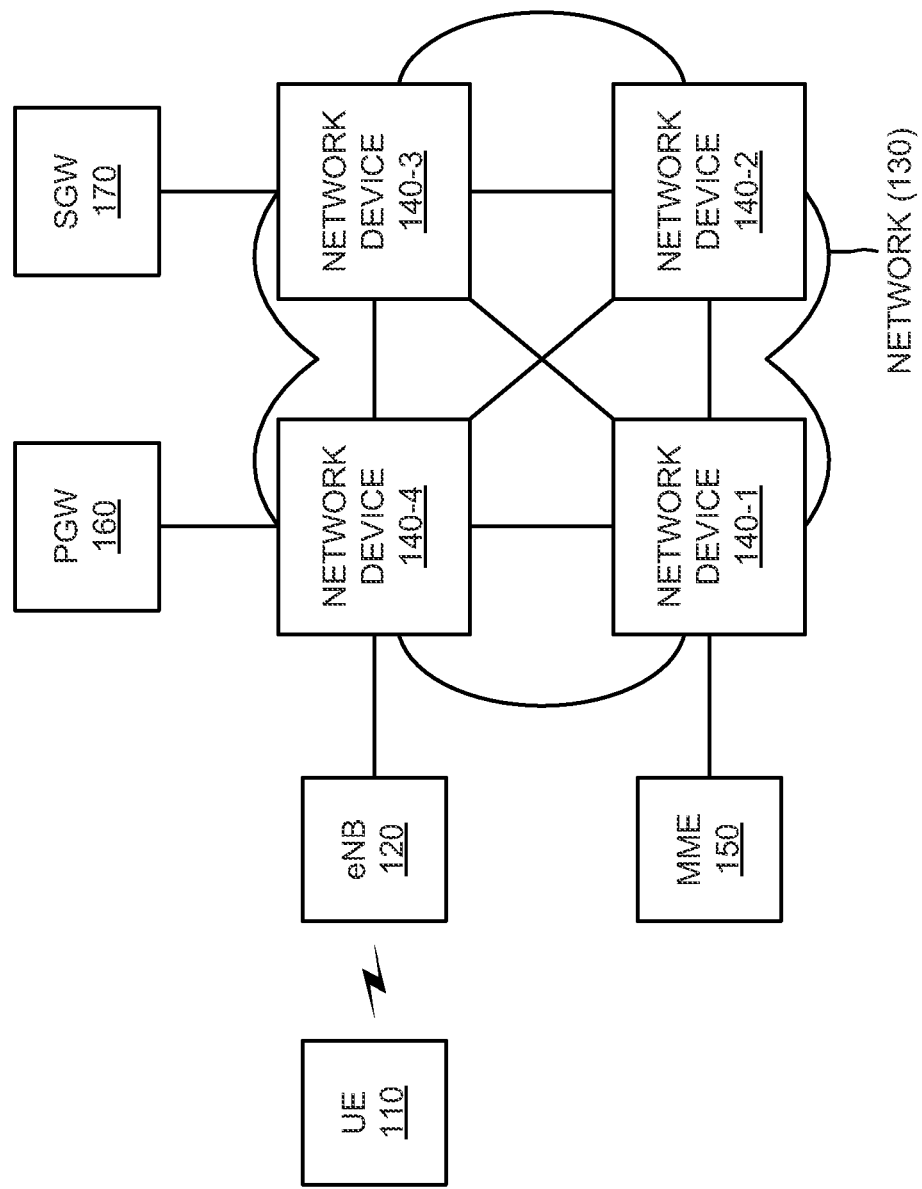
FIG. 1 is a diagram of an example network in which systems and/or methods described herein may be implemented.

FIG. 1 is a diagram of an example network 100 in which systems and/or methods described herein may be implemented. As illustrated, network 100 may include a UE 110, an eNB 120, and a network 130 that includes multiple network devices 140-1 through 140-4 (collectively referred to herein as "network devices 140," and, in some instances, singularly as "network device 140"), a MME 150, a PGW 160, and a SGW 170. Devices and/or networks of network 100 may interconnect via wired and/or wireless connections. For example, UE 110 may wirelessly interconnect with eNB 120. One UE 110, one eNB 120, one network 130, four network devices 140, one MME 150, one PGW 160, and one SGW 170 have been illustrated in FIG. 1 for simplicity. In practice, there may be more UEs 110, eNBs 120, networks 130, network devices 140, MMEs 150, PGWs 160, and/or SGWs 170 than depicted in FIG. 1.

UE 110 may include a radiotelephone; a personal communications system (PCS) terminal that may combine, for example, a cellular radiotelephone with data processing and data communications capabilities; a smart phone; a personal digital assistant (PDA) that can include a radiotelephone, a pager, Internet/intranet access, etc.; a laptop computer; a tablet computer; or other types of computation and/or communication devices. In one example, UE 110 may include a device that is capable of communicating with network 130 via eNB 120.

eNB 120 may include one or more computation and/or communication devices that receive information (e.g., routing information, traffic, etc.) from network 130 and wirelessly transmit that information to UE 110. eNB 120 may also include one or more devices that wirelessly receive information (e.g., connection requests, traffic, etc.) from UE 110 and transmit that information to network 130 and/or to other UEs 110. eNB 120 may combine the functionalities of a base station and a radio network controller (RNC) in second generation (2G) or third generation (3G) radio access networks.

Network 130 may include a local area network (LAN), a wide area network (WAN), a metropolitan area network (MAN), a telephone network, such as the Public Switched Telephone Network (PSTN), an intranet, the Internet, an optical fiber (or fiber optic)-based network, or a combination of networks. In one example implementation, network 130 may include LTE network nodes, such as MME 150, PGW 160, SGW 170, etc.

Network device 140 may include one or more traffic transfer devices, such as a gateway, a router, a switch, a firewall, a network interface card (NIC), a hub, a bridge, a proxy server, an optical add-drop multiplexer (OADM), or some other type of device that processes and/or transfers traffic. In one example implementation, network device 140 may provide for optimized selection of network nodes, such as MME 150, PGW 160, SGW 170, etc., using an integrated control and data plane approach. Network device 140 may leverage features in routing protocols, such as the OSPF protocol, the IS-IS protocol, and the EIGRP, that perform longest prefix matching and metrics to select optimal routes. Network device 140 may eliminate long latencies in the event of network node failures, may eliminate unequal load on network nodes, and may eliminate complex mappings and manual configurations. Network device 140 may automatically load balance among a pool of network nodes by incorporating factors related to load in routing metrics.

MME 150 may include one or more computation and/or communication devices that may be responsible for idle mode tracking and paging procedures (e.g., including retransmissions) for UE 110. MME 150 may be involved in a bearer activation/deactivation process (e.g., for UE 110) and may choose a SGW for UE 110 at an initial attach and at a time of intra-network handover. MME 150 may authenticate UE 110, and non-access stratum (NAS) signaling may terminate at MME 150. MME 150 may generate and allocate temporary identities to UE 110. MME 150 may check authorization of UE 110 to camp on a service provider's Public Land Mobile Network (PLMN) and may enforce roaming restrictions for UE 110. MME 150 may be a termination point for ciphering/integrity protection for NAS signaling and may handle security key management. MME 150 may provide a control plane function for mobility between core and access networks.

PGW 160 may include one or more traffic transfer devices, such as a gateway, a router, a switch, a firewall, a NIC, a hub, a bridge, a proxy server, an OADM, or some other type of device that processes and/or transfers traffic. In one example implementation, PGW 160 may provide connectivity of UE 110 to external PDNs by being a traffic exit/entry point for UE 110. UE 110 may simultaneously connect to more than one PGW 160 for accessing multiple PDNs. PGW 160 may perform policy enforcement, packet filtering for each user, charging support, lawful intercept, and packet screening.

SGW 170 may include one or more traffic transfer devices, such as a gateway, a router, a switch, a firewall, a NIC, a hub, a bridge, a proxy server, an OADM, or some other type of device that processes and/or transfers traffic. In one example implementation, SGW 170 may act as a mobility anchor for a user plane during inter-eNB handovers. For an idle state UE 110, SGW 170 may terminate a downlink (DL) data path and may trigger paging when DL traffic arrives for UE 110. SGW 170 may manage and store contexts associated with UE 110 (e.g., parameters of an IP bearer service, network internal routing information, etc.).

Although FIG. 1 shows example devices/networks of network 100, in other implementations, network 100 may include fewer devices/networks, different devices/networks, differently arranged devices/networks, or additional devices/networks than depicted in FIG. 1. Alternatively, or additionally, one or more devices/networks of network 100 may perform one or more other tasks described as being performed by one or more other devices/networks of network 100.

Figure 2:
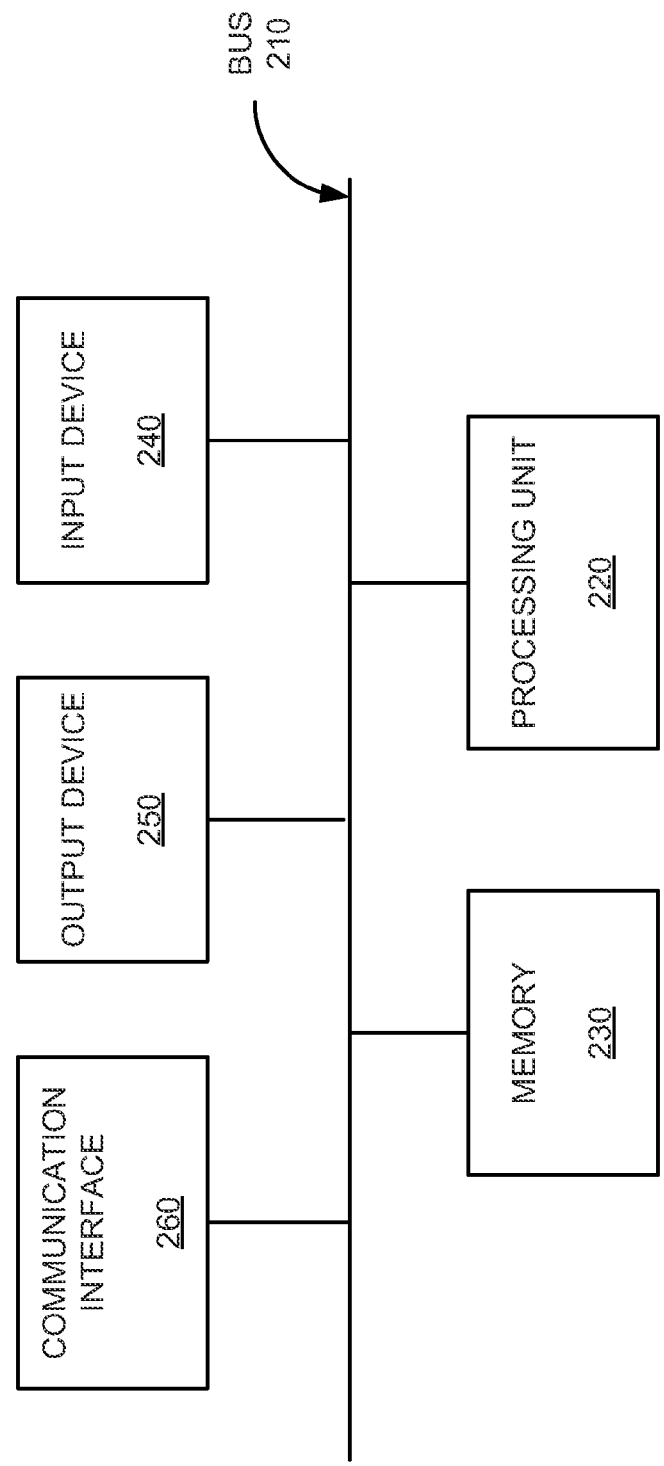
FIG. 2 is a diagram of example components of a device that may correspond to one of the devices of the network depicted in FIG. 1.

FIG. 2 is a diagram of example components of a device 200 that may correspond to one or more devices (e.g., UE 110, eNB 120, MME 150, PGW 160, and/or SGW 170) of network 100 (FIG. 1). In one example implementation, one or more of the devices of network 100 may include one or more devices 200 or one or more components of device 200. As illustrated in FIG. 2, device 200 may include a bus 210, a processing unit 220, a memory 230, an input device 240, an output device 250, and a communication interface 260.

Bus 210 may permit communication among the components of device 200. Processing unit 220 may include one or more processors or microprocessors that interpret and execute instructions. In other implementations, processing unit 220 may be implemented as or include one or more ASICs, FPGAs, or the like.

Memory 230 may include a RAM or another type of dynamic storage device that stores information and instructions for execution by processing unit 220, a ROM or another type of static storage device that stores static information and instructions for the processing unit 220, and/or some other type of magnetic or optical recording medium and its corresponding drive for storing information and/or instructions.

Input device 240 may include a device that permits an operator to input information to device 200, such as a keyboard, a keypad, a mouse, a pen, a microphone, a touch screen display, one or more biometric mechanisms, and the like. Output device 250 may include a device that outputs information to the operator, such as a display, a speaker, etc.

Communication interface 260 may include any transceiver-like mechanism that enables device 200 to communicate with other devices and/or systems. For example, communication interface 260 may include mechanisms for communicating with other devices, such as other devices of network 100.

As described herein, device 200 may perform certain operations in response to processing unit 220 executing software instructions contained in a computer-readable medium, such as memory 230. A computer-readable medium may be defined as a non-transitory memory device. A memory device may include space within a single physical memory device or spread across multiple physical memory devices. The software instructions may be read into memory 230 from another computer-readable medium or from another device via communication interface 260. The software instructions contained in memory 230 may cause processing unit 220 to perform processes described herein. Alternatively, or additionally, hardwired circuitry may be used in place of or in combination with software instructions to implement processes described herein. Thus, implementations described herein are not limited to any specific combination of hardware circuitry and software.

Although FIG. 2 shows example components of device 200, in other implementations, device 200 may include fewer components, different components, differently arranged components, or additional components than depicted in FIG. 2. Alternatively, or additionally, one or more components of device 200 may perform one or more other tasks described as being performed by one or more other components of device 200.

Figure 3:
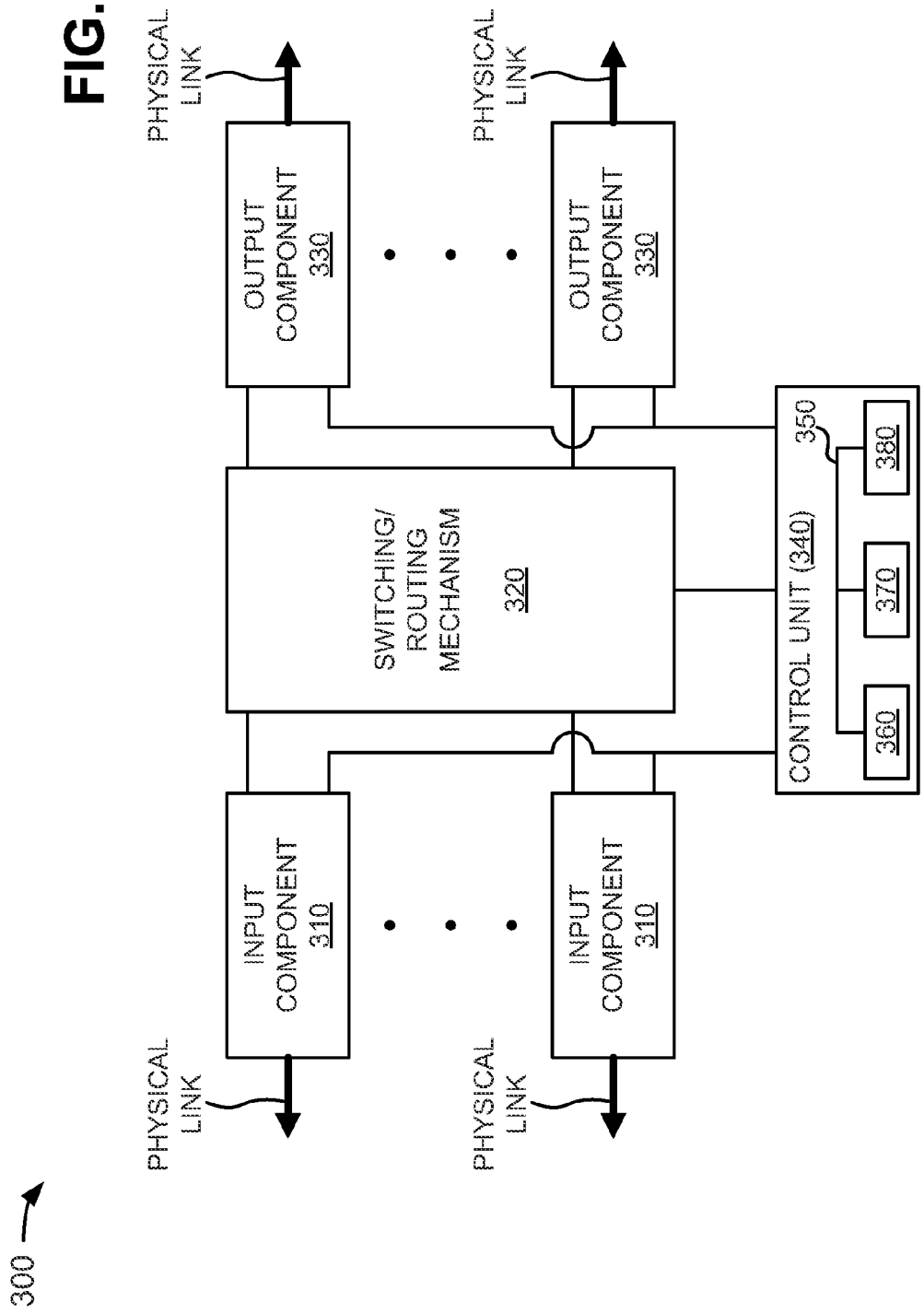
FIG. 3 is a diagram of example components of a network device depicted in FIG. 1.

FIG. 3 is a diagram of example components of a device 300 that may correspond to network device 140 (FIG. 1). In one example implementation, network device 140 may include one or more devices 300 or one or more components of device 300. As shown in FIG. 3, device 300 may include input components 310, a switching/routing mechanism 320, output components 330, and a control unit 340.

Input components 310 may be a point of attachment for physical links and may be a point of entry for incoming traffic, such as packets. Input components 310 may process incoming traffic, such as by performing data link layer encapsulation or decapsulation. In an example implementation, input components 310 may send and/or receive packets.

Switching/routing mechanism 320 may interconnect input components 310 with output components 330. Switching/routing mechanism 320 may be implemented using many different techniques. For example, switching/routing mechanism 320 may be implemented via busses, via crossbars, and/or with shared memories. The shared memories may act as temporary buffers to store traffic from input components 310 before the traffic is eventually scheduled for delivery to output components 330.

Output components 330 may store packets and may schedule packets for service on output physical links Output components 330 may include scheduling algorithms that support priorities and guarantees. Output components 330 may support data link layer encapsulation and decapsulation, and/or a variety of higher-level protocols. In an example implementation, output components 330 may send packets and/or receive packets.

Control unit 340 may use routing protocols and one or more forwarding tables for forwarding packets. Control unit 340 may connect with input components 310, switching/routing mechanism 320, and output components 330. Control unit 340 may compute a forwarding table, implement routing protocols, and/or run software to configure and manage device 300. Control unit 340 may determine routing for any packet whose destination address may not be found in the forwarding table.

In an example implementation, control unit 340 may include a bus 350 that may include a path that permits communication among a processor 360, a memory 370, and a communication interface 380. Processor 360 may include one or more processors, microprocessors, ASICs, FPGAs, or other types of processing units that may interpret and execute instructions. Memory 370 may include a RAM, a ROM device, a magnetic and/or optical recording medium and its corresponding drive, and/or another type of static and/or dynamic storage device that may store information and instructions for execution by processor 360. Memory 370 may also temporarily store incoming traffic (e.g., a header of a packet or an entire packet) from input components 310, for processing by processor 360, before a packet is directed back to switching/routing mechanism 320, transported by switching/routing mechanism 320, and eventually scheduled to be sent to output components 330. Communication interface 380 may include any transceiver-like mechanism that enables control unit 340 to communicate with other devices and/or systems.

As described herein, device 300 may perform certain operations in response to processor 360 executing software instructions contained in a computer-readable medium, such as memory 370. The software instructions may be read into memory 370 from another computer-readable medium, such as a data storage device, or from another device via communication interface 380. The software instructions contained in memory 370 may cause processor 360 to perform processes described herein. Alternatively, hardwired circuitry may be used in place of or in combination with software instructions to implement processes described herein. Thus, implementations described herein are not limited to any specific combination of hardware circuitry and software.

Although FIG. 3 shows example components of device 300, in other implementations, device 300 may include fewer components, different components, differently arranged components, or additional components than depicted in FIG. 3. Alternatively, or additionally, one or more components of device 300 may perform one or more other tasks described as being performed by one or more other components of device 300.

Figure 4:
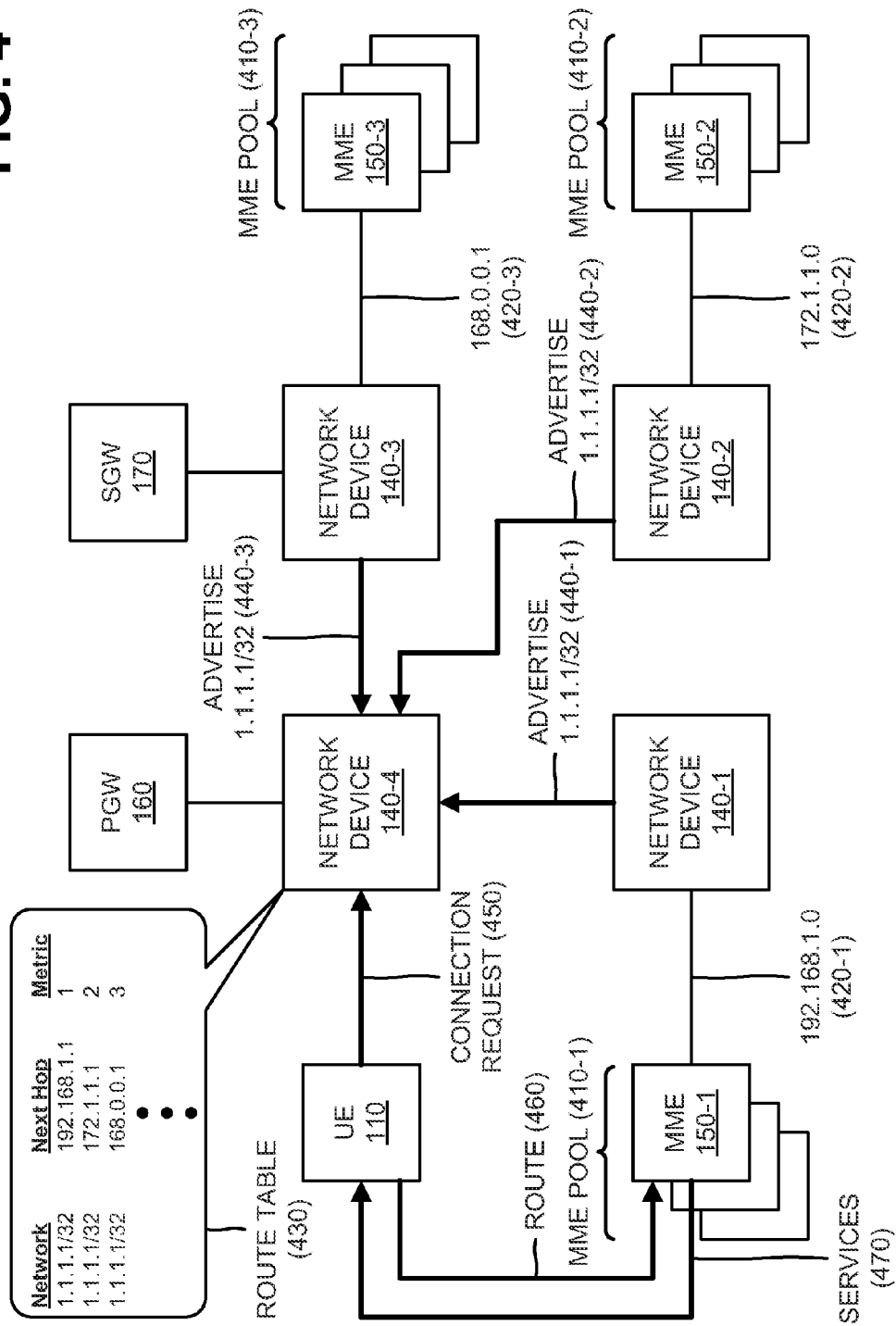
FIG. 4 is a diagram of example MME selection operations capable of being performed by an example portion of the network in FIG. 1.

FIG. 4 is a diagram of example MME selection operations capable of being performed by an example portion 400 of network 100 (FIG. 1). As shown, network portion 400 may include UE 110, network devices 140-1 through 140-4, a first MME 150-1, a second MME 150-2, a third MME 150-3, PGW 160, and SGW 170. UE 110, network devices 140, MMEs 150, PGW 160, and SGW 170 may include the features described above in connection with, for example, one or more of FIGS. 1-3.

As further shown in FIG. 4, first MME 150-1 may be provided in a first MME pool 410-1 of multiple MMEs, and may include a physical interface IP address 420-1 (e.g., address "192.168.1.0") established with network device 140-1. Second MME 150-2 may be provided in a second MME pool 410-2 of multiple MMEs, and may include a physical interface IP address 420-2 (e.g., address "172.1.1.0") established with network device 140-2. Third MME 150-3 may be provided in a third MME pool 410-3 of multiple MMEs, and may include a physical interface IP address 420-3 (e.g., address "168.0.0.1") established with network device 140-3. Physical interface IP addresses 420-1, 420-2, and 420-3 may be determined by the network architecture and assigned by a network administrator.

Network device 140-4 may connect with UE 110, via eNB 120 (not shown), and may include a route table 430. Route table 430 may include a network address field, a next hop field, and a metric field. The network address field may include entries for loopback IP addresses (e.g., IP addresses designated for routing information from an originating device back to a source device without intentional processing or modification) associated with MMEs 150. The next hop field may include entries for physical interface IP addresses associated with MMEs 150. The metric field may include entries for metrics assigned to MMEs 150 associated with the physical interface IP addresses identified in the next hop field. The metrics may be influenced by the loads placed on MMEs 150, distances to MMEs 150, costs of connecting to MMEs 150, etc.

In one example implementation, first MME 150-1, second MME 150-2, and third MME 150-3 may be assigned a common loopback IP address (e.g., address "1.1.1.1/32"). As further shown in FIG. 4, first MME 150-1 may advertise, via network device 140-1 and to network device 140-4, the common loopback IP address, the physical interface IP address, and the metrics of first MME 150-1, as indicated by reference number 440-1. Second MME 150-2 may advertise, via network device 140-2 and to network device 140-4, the common loopback IP address, the physical interface IP address, and the metrics of second MME 150-2, as indicated by reference number 440-2. Third MME 150-3 may advertise, via network device 140-3 and to network device 140-4, the common loopback IP address, the physical interface IP address, and the metrics of third MME 150-3, as indicated by reference number 440-3. Network device 140-4 may receive advertisements 440-1, 440-2, and 440-3, and may populate route table 430 with the information included in advertisements 440-1, 440-2, and 440-3.

UE 110 may generate a connection request 450 to connect to network 130 (not shown), and may provide connection request 450 to network device 140-4. Network device 140-4 may receive connection request 450, and may determine an optimal MME 150 to which to route a communication session of UE 110 based on connection request 450 and based on the metrics provided in route table 430. For example, assuming a lower metric value indicates a more optimal MME 150, network device 140-4 may determine that MME 150-1 (e.g., associated with the next hop of "192.168.1.1"), which has a metric value of one (1), is the optimal MME 150 to which to route the communication session of UE 110.

Based on the determination of the optimal MME 150, network device 140-4 may route the communication session of UE 110 to MME 150-1, as indicated by reference number 460. UE 110 may connect to MME 150-1, and MME 150-1 may enable UE 110 to connect to network 130 and receive services 470 from network 130. In one example, MME 150-1 may serve as a routed device, rather than a host node, so that loopback may be achieved.

Although FIG. 4 shows example components of network portion 400, in other implementations, network portion 400 may include fewer components, different components, differently arranged components, or additional components than depicted in FIG. 4. Additionally, or alternatively, one or more components of network portion 400 may perform one or more other tasks described as being performed by one or more other components of network portion 400.

Figure 5:
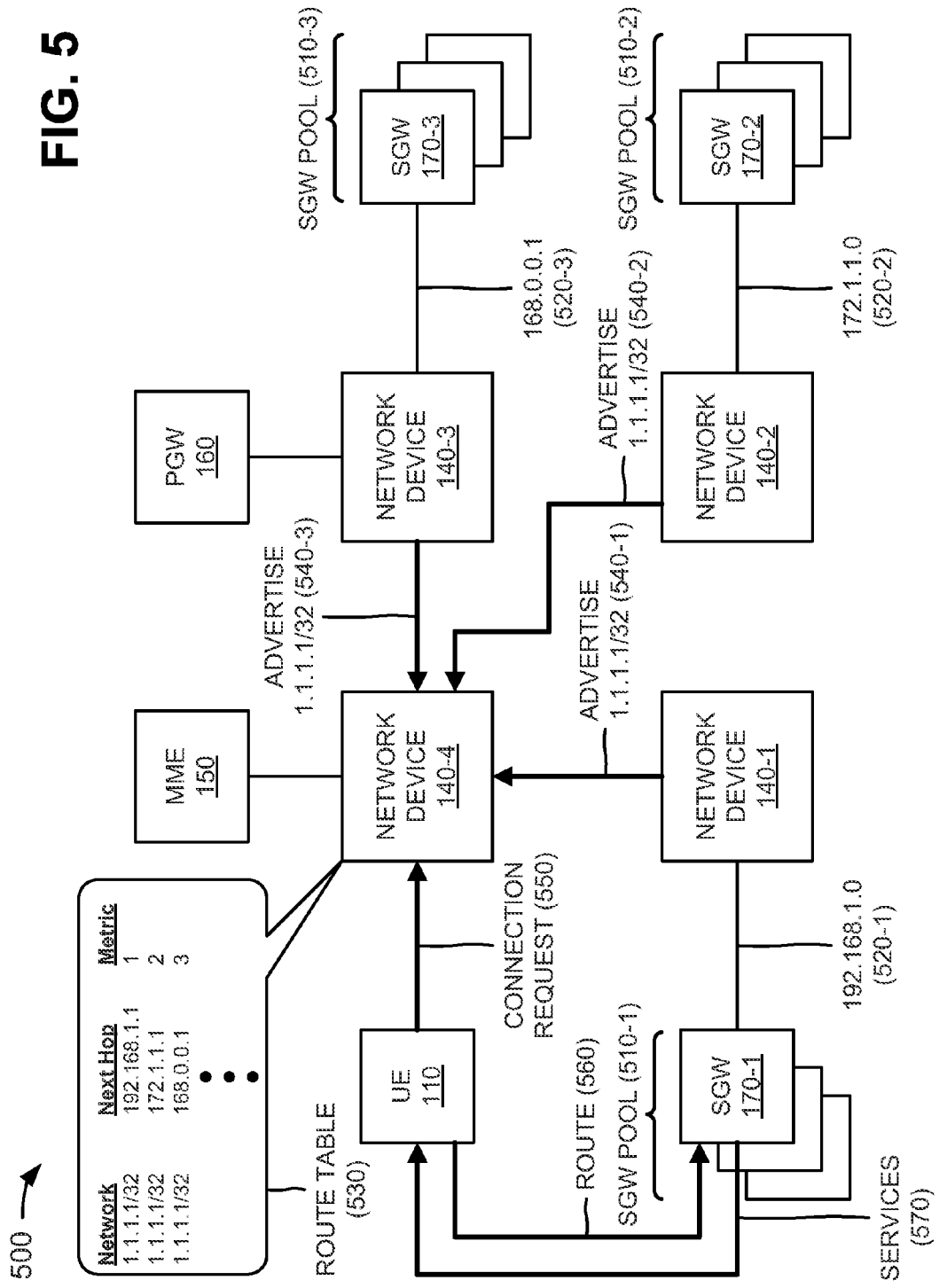
FIG. 5 is a diagram of example SGW selection operations capable of being performed by another example portion of the network in FIG. 1.

FIG. 5 is a diagram of example SGW selection operations capable of being performed by another example portion 500 of network 100 (FIG. 1). As shown, network portion 500 may include UE 110, network devices 140-1 through 140-4, MME 150, PGW 160, a first SGW 170-1, a second SGW 170-2, and a third SGW 170-3. UE 110, network devices 140, MME 150, PGW 160, and SGWs 170 may include the features described above in connection with, for example, one or more of FIGS. 1-4.

As further shown in FIG. 5, first SGW 170-1 may be provided in a first SGW pool 510-1 of multiple SGWs, and may include a physical interface IP address 520-1 (e.g., address "192.168.1.0") established with network device 140-1. Second SGW 170-2 may be provided in a second SGW pool 510-2 of multiple SGWs, and may include a physical interface IP address 520-2 (e.g., address "172.1.1.0") established with network device 140-2. Third SGW 170-3 may be provided in a third SGW pool 510-3 of multiple SGWs, and may include a physical interface IP address 520-3 (e.g., address "168.0.0.1") established with network device 140-3. Physical interface IP addresses 520-1, 520-2, and 520-3 may be determined by the network architecture and assigned by a network administrator.

Network device 140-4 may connect with UE 110, via eNB 120 (not shown), and may include a route table 530. Route table 530 may include a network address field, a next hop field, and a metric field. The network address field may include entries for loopback IP addresses associated with SGWs 170. The next hop field may include entries for physical interface IP addresses associated with SGWs 170. The metric field may include entries for metrics assigned to SGWs 170 associated with the physical interface IP addresses identified in the next hop field. The metrics may be influenced by the loads placed on SGWs 170, distances to SGWs 170, costs of connecting to SGWs 170, etc.

In one example implementation, first SGW 170-1, second SGW 170-2, and third SGW 170-3 may be assigned a common loopback IP address (e.g., address "1.1.1.1/32"). As further shown in FIG. 5, first SGW 170-1 may advertise, via network device 140-1 and to network device 140-4, the common loopback IP address, the physical interface IP address, and the metrics of first SGW 170-1, as indicated by reference number 540-1. Second SGW 170-2 may advertise, via network device 140-2 and to network device 140-4, the common loopback IP address, the physical interface IP address, and the metrics of second SGW 170-2, as indicated by reference number 540-2. Third SGW 170-3 may advertise, via network device 140-3 and to network device 140-4, the common loopback IP address, the physical interface IP address, and the metrics of third SGW 170-3, as indicated by reference number 540-3. Network device 140-4 may receive advertisements 540-1, 540-2, and 540-3, and may populate route table 530 with the information included in advertisements 540-1, 540-2, and 540-3.

UE 110 may generate a connection request 550 to connect to network 130 (not shown), and may provide connection request 550 to network device 140-4. Network device 140-4 may receive connection request 550, and may determine an optimal SGW 170 to which to route a communication session of UE 110 based on connection request 550 and based on the metrics provided in route table 530. For example, assuming a lower metric value indicates a more optimal SGW 170, network device 140-4 may determine that SGW 170-1 (e.g., associated with the next hop of "192.168.1.1"), which has a metric value of one (1), is the optimal SGW 170 to which to route the communication session of UE 110.

Based on the determination of the optimal SGW 170, network device 140-4 may route the communication session of UE 110 to SGW 170-1, as indicated by reference number 560. UE 110 may connect to SGW 170-1, and SGW 170-1 may enable UE 110 to connect to network 130 and receive services 570 from network 130. In one example, SGW 170-1 may serve as a routed device, rather than a host node, so that loopback may be achieved.

Although FIG. 5 shows example components of network portion 500, in other implementations, network portion 500 may include fewer components, different components, differently arranged components, or additional components than depicted in FIG. 5. Additionally, or alternatively, one or more components of network portion 500 may perform one or more other tasks described as being performed by one or more other components of network portion 500.

Figure 6:
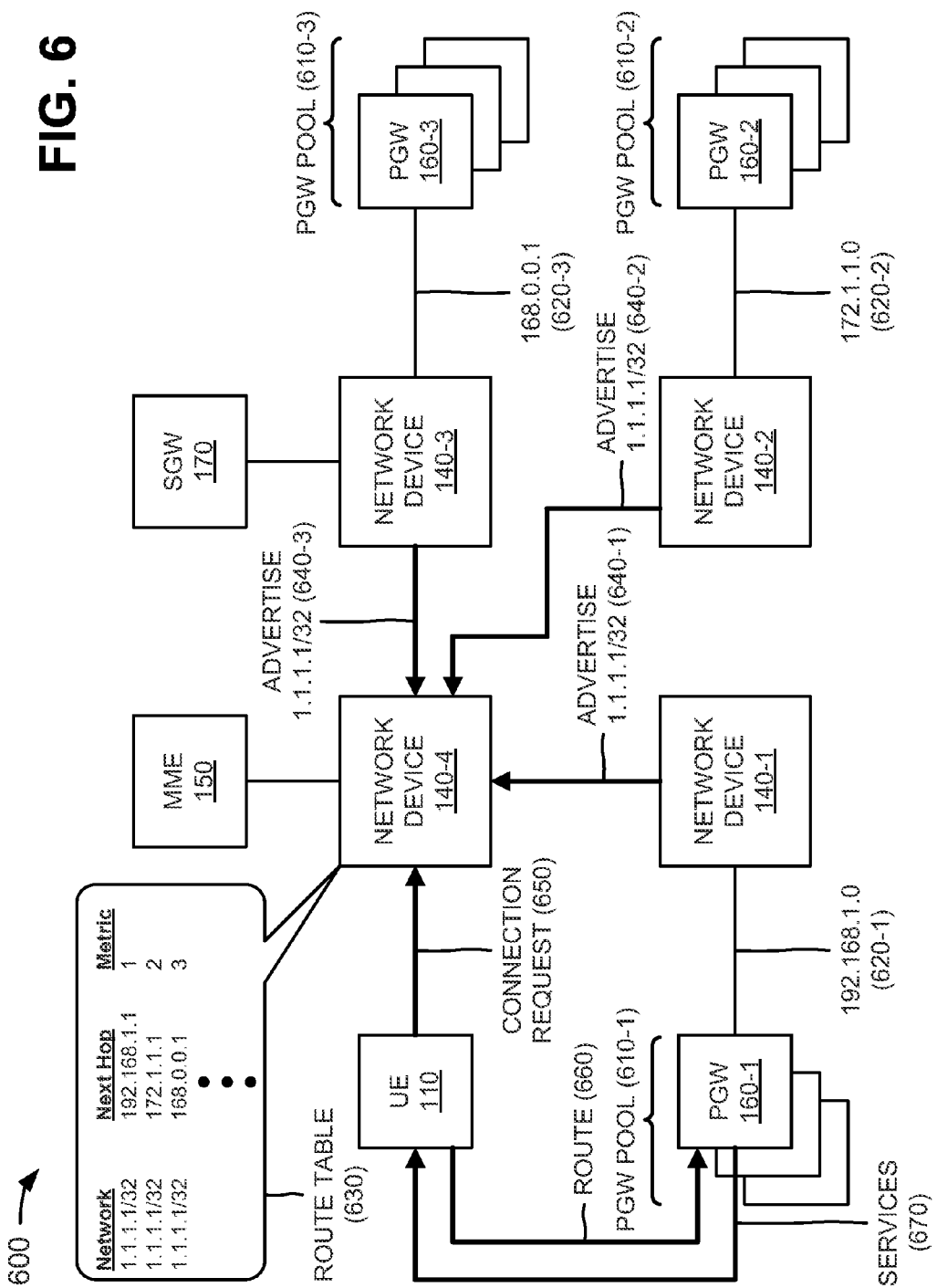
FIG. 6 is a diagram of example PGW selection operations capable of being performed by still another example portion of the network in FIG. 1.

FIG. 6 is a diagram of example PGW selection operations capable of being performed by still another example portion 600 of network 100 (FIG. 1). As shown, network portion 600 may include UE 110, network devices 140-1 through 140-4, MME 150, a first PGW 160-1, a second PGW 160-2, a third PGW 160-3, and SGW 170. UE 110, network devices 140, MME 150, PGWs 160, and SGW 170 may include the features described above in connection with, for example, one or more of FIGS. 1-5.

As further shown in FIG. 6, first PGW 160-1 may be provided in a first PGW pool 610-1 of multiple PGWs, and may include a physical interface IP address 620-1 (e.g., address "192.168.1.0") established with network device 140-1. Second PGW 160-2 may be provided in a second PGW pool 610-2 of multiple PGWs, and may include a physical interface IP address 620-2 (e.g., address "172.1.1.0") established with network device 140-2. Third PGW 160-3 may be provided in a third PGW pool 610-3 of multiple PGWs, and may include a physical interface IP address 620-3 (e.g., address "168.0.0.1") established with network device 140-3. Physical interface IP addresses 620-1, 620-2, and 620-3 may be determined by the network architecture and assigned by a network administrator.

Network device 140-4 may connect with UE 110, via eNB 120 (not shown), and may include a route table 630. Route table 630 may include a network address field, a next hop field, and a metric field. The network address field may include entries for loopback IP addresses associated with PGWs 160. The next hop field may include entries for physical interface IP addresses associated with PGWs 160. The metric field may include entries for metrics assigned to PGWs 160 associated with the physical interface IP addresses identified in the next hop field. The metrics may be influenced by the loads placed on PGWs 160, distances to PGWs 160, costs of connecting to PGWs 160, etc.

In one example implementation, first PGW 160-1, second PGW 160-2, and third PGW 160-3 may be assigned a common loopback IP address (e.g., address "1.1.1.1/32"). As further shown in FIG. 6, first PGW 160-1 may advertise, via network device 140-1 and to network device 140-4, the common loopback IP address, the physical interface IP address, and the metrics of first PGW 160-1, as indicated by reference number 640-1. Second PGW 160-2 may advertise, via network device 140-2 and to network device 140-4, the common loopback IP address, the physical interface IP address, and the metrics of second PGW 160-2, as indicated by reference number 640-2. Third PGW 160-3 may advertise, via network device 140-3 and to network device 140-4, the common loopback IP address, the physical interface IP address, and the metrics of third PGW 160-3, as indicated by reference number 640-3. Network device 140-4 may receive advertisements 640-1, 640-2, and 640-3, and may populate route table 630 with the information included in advertisements 640-1, 640-2, and 640-3.

UE 110 may generate a connection request 650 to connect to network 130 (not shown), and may provide connection request 650 to network device 140-4. Network device 140-4 may receive connection request 650, and may determine an optimal PGW 160 to which to route a communication session of UE 110 based on connection request 650 and based on the metrics provided in route table 630. For example, assuming a lower metric value indicates a more optimal PGW 160, network device 140-4 may determine that PGW 160-1 (e.g., associated with the next hop of "192.168.1.1"), which has a metric value of one (1), is the optimal PGW 160 to which to route the communication session of UE 110.

Based on the determination of the optimal PGW 160, network device 140-4 may route the communication session of UE 110 to PGW 160-1, as indicated by reference number 660. UE 110 may connect to PGW 160-1, and PGW 160-1 may enable UE 110 to connect to network 130 and receive services 670 from network 130. In one example, PGW 160-1 may serve as a routed device, rather than a host node, so that loopback may be achieved.

In one example, implementations described herein may assign a common loopback IP address to all network nodes that can be grouped by TACs of a network, along with the physical interface IP addresses. All network nodes associated with a group of TACs may be assigned the same loopback IP address. For example, if particular network nodes are associated with particular TACs, the particular network nodes may have the same loopback IP address and subnet mask. Implementations described herein may utilize the best metric to determine to which network node, in a group of network nodes, to forward UE 110. The group of network nodes may be able to modify their associated metrics by incorporating load and other factors that optimize network node selection into the metrics.

In the implementations depicted in FIGS. 4-6, pools (e.g., MME pools, SGW pools, and SGW pools) may be established and may enable the network nodes (e.g., MMEs, SGWs, and PGWs) in the pools to share state information in order to improve load balancing and availability. Network nodes in a pool may use a multicast approach to share the state information associated with a subscriber (e.g., UE 110) connection in order to avoid requiring a reconnect.

In the implementations depicted in FIGS. 4-6, the network nodes may assign appropriate values in the metric field during route advertisement to incorporate load and other factors that influence optimal network node selection. In the event of a network node failure, route updates may cease and a route may be retracted for the failed network node so that automatic failure detection and recovery may be provided within seconds. If a new network node is added to network 130, a central data storage device may not be updated with information about the new network node. Rather, network 130 may automatically discover the new network node and may begin receiving subscriber traffic since the routing protocol may automatically recognize the new network node and routes may be advertised. This may reduce the latency involved in identifying the new network node since an IP address of the new network node may be automatically provisioned in the route tables and UE 110 or eNB 120 may point to the loopback IP address.

Although FIG. 6 shows example components of network portion 600, in other implementations, network portion 600 may include fewer components, different components, differently arranged components, or additional components than depicted in FIG. 6. Additionally, or alternatively, one or more components of network portion 600 may perform one or more other tasks described as being performed by one or more other components of network portion 600.

Figure 7:
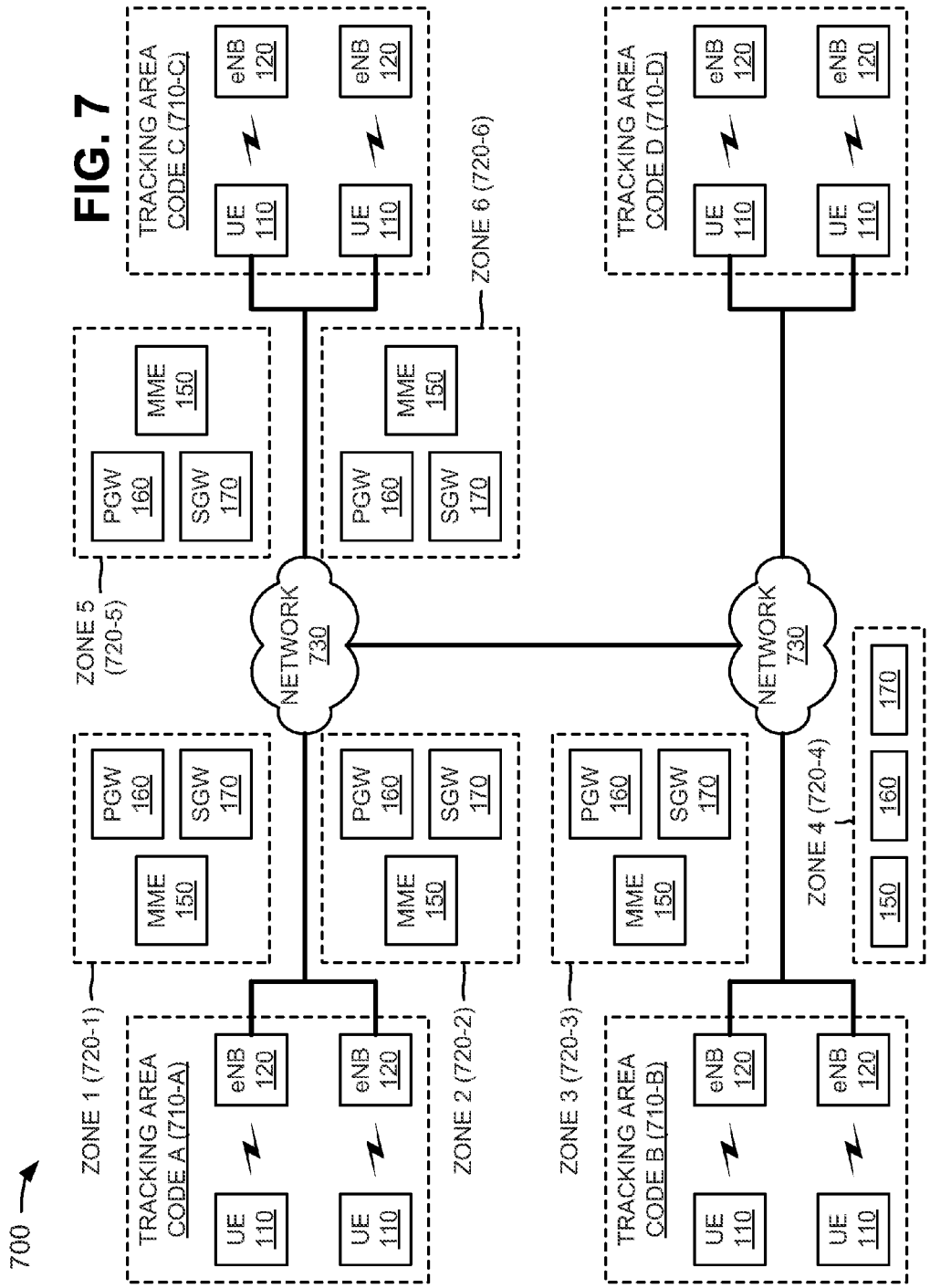
FIG. 7 is a diagram of an example deployment scenario according to an implementation described herein.

FIG. 7 is a diagram of an example deployment scenario 700 according to an implementation described herein. As shown, scenario 700 may include four tracking area codes (TACs) 710-A, 710-B, 710-C, and 710-D (collectively referred to herein as "TACs 710," and, in some instances, singularly as "TAC 710") and six zones 720-1 through 720-6 (collectively referred to herein as "zones 720," and, in some instances, singularly as "zone 720"). Each TAC 710 may include one or more UEs 110 and eNBs 120. Each zone 720 may include MME 150, PGW 160, and SGW 170. UEs 110, eNBs 120, MMEs 150, PGWs 160, and SGWs 170 may include the features described above in connection with, for example, one or more of FIGS. 1-6.

As further shown in FIG. 7, eNBs 120 may interconnect with networks 730. Network 730 may include a LAN, a WAN, a MAN, a telephone network, such as the PSTN, an intranet, the Internet, an optical fiber (or fiber optic)-based network, or a combination of networks.

In one example, zones 720-1 and 720-5 may service TACs 710-A and 710-C. Zones 720-2 and 720-3 may service TACs 710-A and 710-B. Zone 720-4 may service TACs 710-B and 710-D. Zone 720-6 may service TACs 710-A, 710-C, and 710-D. TAC 710-A may be associated with a loopback IP address of "1.1.1.1/32"; TAC 710-B may be associated with a loopback IP address of "1.1.1.2/32"; TAC 710-C may be associated with a loopback IP address of "1.1.1.3/32"; and TAC 710-D may be associated with a loopback IP address of "1.1.1.4/32."

Based on this example, SGW 170 located in zone 720-1 may service TAC 710-A and 710-C and SGW 170 may be configured with two loopback IP addresses: "1.1.1.1/32" and "1.1.1.3/32." All other zones 720 that contain a SGW 170 may be configured accordingly with the loopback IP addresses as specified in the example. If a particular eNB 120 in TAC 710-A is searching for a SGW 170, the particular eNB 120 may attempt to connect with a SGW 170 via loopback IP address "1.1.1.1/32." The candidate SGWs 170 that may serve the particular eNB 120 may include SGWs 170 associated with loopback IP address "1.1.1.1/32," which may include SGWs 170 provided in zones 720-1, 720-2, 720-3, 720-5, and 720-6, as specified in the example. An internal routing protocol may control an actual route to an optimal SGW 170 by automatically configuring and load balancing to the optimal SGW 170 based on metrics.

Although FIG. 7 shows example components of scenario 700, in other implementations, scenario 700 may include fewer components, different components, differently arranged components, or additional components than depicted in FIG. 7. Additionally, or alternatively, one or more components of scenario 700 may perform one or more other tasks described as being performed by one or more other components of scenario 700.

Figure 8:
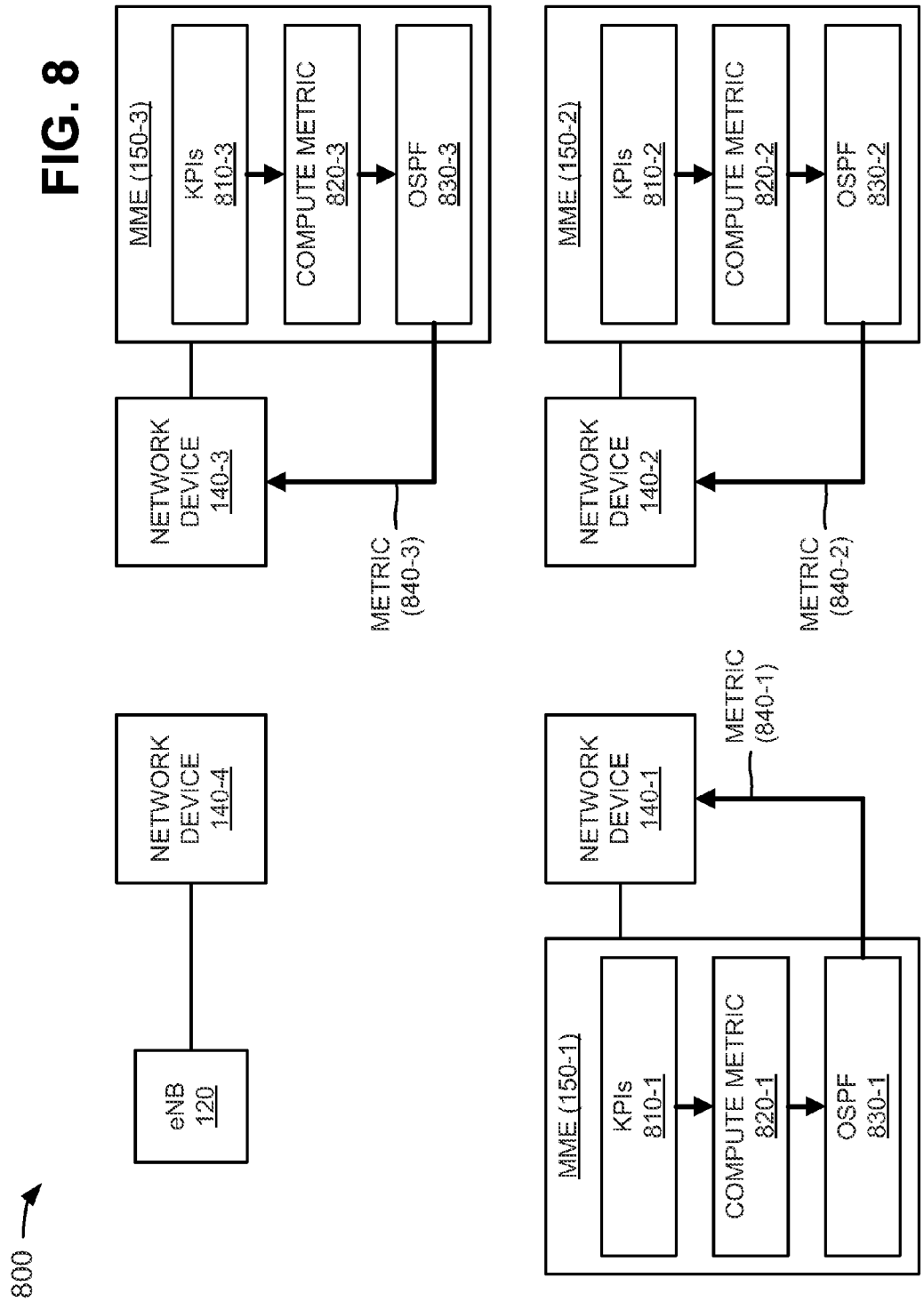
FIG. 8 is a diagram of example MME metric computations capable of being performed by a further example portion of the network in FIG. 1.

FIG. 8 is a diagram of example MME metric computations capable of being performed by a further example portion 800 of network 100 (FIG. 1). As shown, network portion 800 may include eNB 120, network devices 140-1 through 140-4, first MME 150-1, second MME 150-2, and third MME 150-3. eNB 120, network devices 140, and MMEs 150 may include the features described above in connection with, for example, one or more of FIGS. 1-7.

As further shown in FIG. 8, first MME 150-1 may compute key performance indicators (KPIs) 810-1, such as an attach failure ratio, a handover failure ratio, latency, jitter, frame loss, bandwidth, a distance, a cost, etc., as well as raw statistics that determine a load on first MME 150-1. First MME 150-1 may utilize KPIs 810-1 and the raw statistics to compute a metric value 840-1 associated with first MME 150-1, as indicated by reference number 820-1. A protocol process, such as an OSPF process 830-1, may receive metric value 840-1 and may advertise metric value 840-1 to network device 140-1.

Second MME 150-2 may compute KPIs 810-2, such as an attach failure ratio, a handover failure ratio, latency, jitter, frame loss, bandwidth, a distance, a cost, etc., as well as raw statistics that determine a load on second MME 150-2. Second MME 150-2 may utilize KPIs 810-2 and the raw statistics to compute a metric value 840-2 associated with second MME 150-2, as indicated by reference number 820-2. A protocol process, such as an OSPF process 830-2, may receive metric value 840-2 and may advertise metric value 840-2 to network device 140-2.

Third MME 150-3 may compute KPIs 810-3, such as an attach failure ratio, a handover failure ratio, latency, jitter, frame loss, bandwidth, a distance, a cost, etc., as well as raw statistics that determine a load on third MME 150-3. Third MME 150-3 may utilize KPIs 810-3 and the raw statistics to compute a metric value 840-3 associated with third MME 150-3, as indicated by reference number 820-3. A protocol process, such as an OSPF process 830-3, may receive metric value 840-3 and may advertise metric value 840-3 to network device 140-3.

An interior routing protocol may enable network devices 140 to provide metric values 840-1, 840-2, and 840-3 in a route table that may be used to automatically route to an optimal MME 150 at any particular point in time. In one example implementation, the operations depicted in FIG. 8 may be utilized for PGW 160 and/or SGW 170 selection and routing.

Although FIG. 8 shows example components of network portion 800, in other implementations, network portion 800 may include fewer components, different components, differently arranged components, or additional components than depicted in FIG. 8. Additionally, or alternatively, one or more components of network portion 800 may perform one or more other tasks described as being performed by one or more other components of network portion 800.

Figure 9:
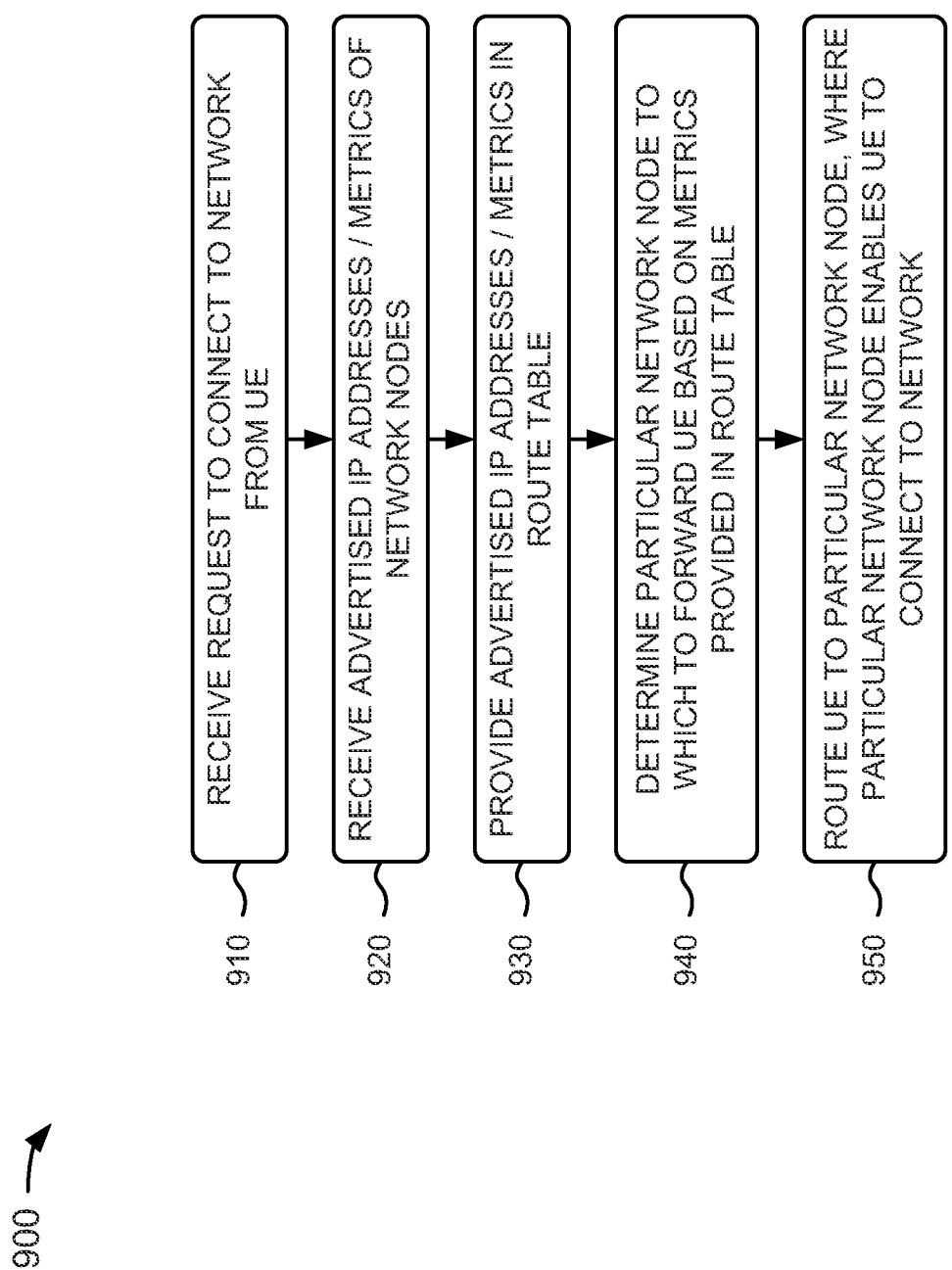
FIGS. 9-11 are flow charts of an example process for performing optimized network node selection according to an implementation described herein.
Figure 10:
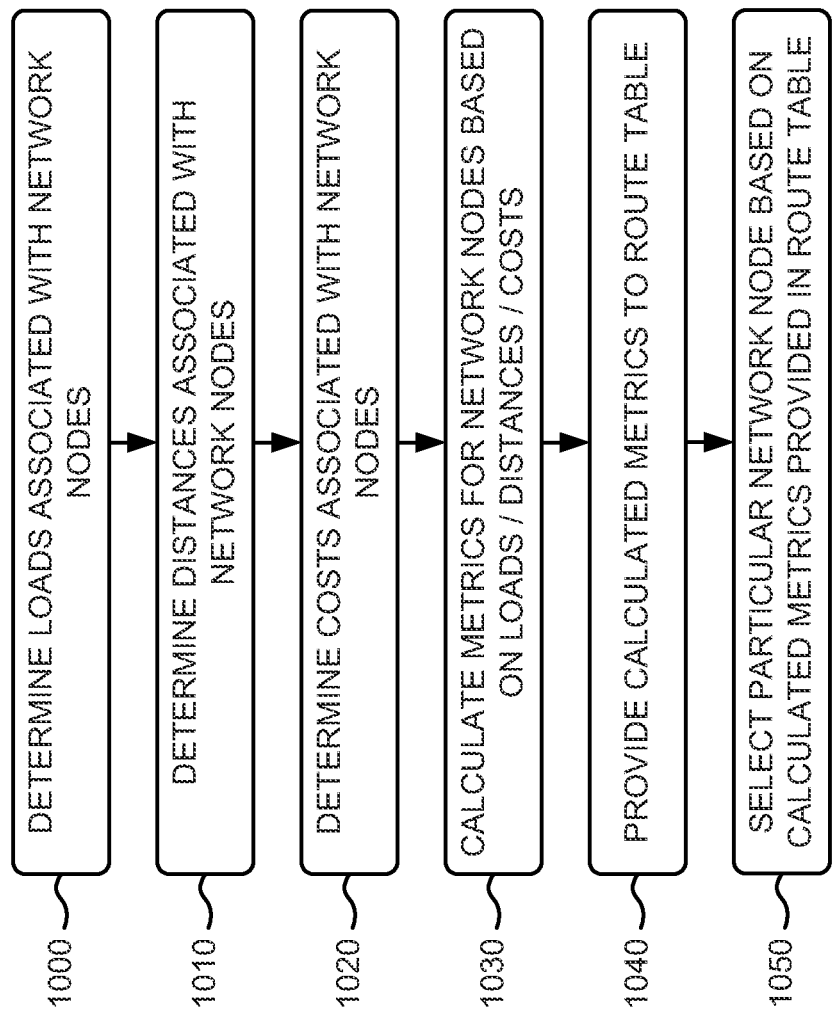
Figure 11:
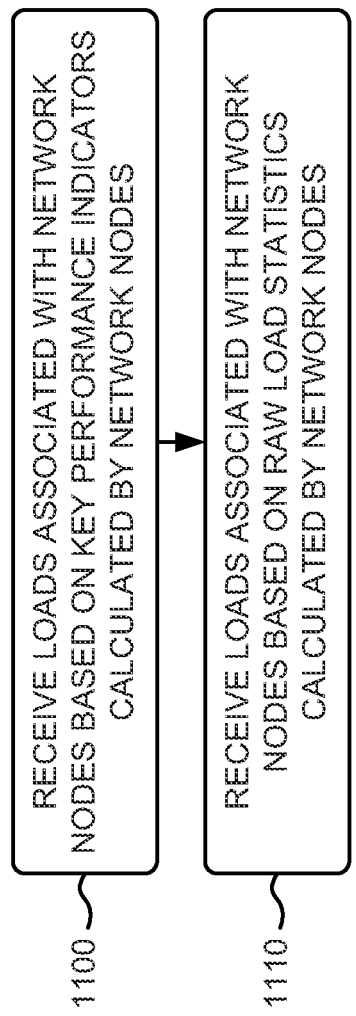

FIGS. 9-11 are flow charts of an example process 900 for performing optimized network node selection according to an implementation described herein. In one implementation, process 900 may be performed by one or more network devices 140. Alternatively, or additionally, some or all of process 900 may be performed by another device or group of devices, including or excluding one or more network devices 140.

As shown in FIG. 9, process 900 may include receiving a request to connect to a network from a UE (block 910), and receiving advertised IP addresses and metrics associated with network nodes (block 920). For example, in an implementation described above in connection with FIG. 4, first MME 150-1, second MME 150-2, and third MME 150-3 may be assigned a common loopback IP address (e.g., address "1.1.1.1/32"). First MME 150-1 may advertise, via network device 140-1 and to network device 140-4, the common loopback IP address, the physical interface IP address, and the metrics of first MME 150-1, as indicated by reference number 440-1. Second MME 150-2 may advertise, via network device 140-2 and to network device 140-4, the common loopback IP address, the physical interface IP address, and the metrics of second MME 150-2, as indicated by reference number 440-2. Third MME 150-3 may advertise, via network device 140-3 and to network device 140-4, the common loopback IP address, the physical interface IP address, and the metrics of third MME 150-3, as indicated by reference number 440-3. Network device 140-4 may receive advertisements 440-1, 440-2, and 440-3. UE 110 may generate connection request 450 to connect to network 130 (not shown), and may provide connection request 450 to network device 140-4. Network device 140-4 may receive connection request 450.

As further shown in FIG. 9, process 900 may include providing the advertised IP addresses and metrics in a route table (block 930), and determining a particular network node to which to forward the UE based on the metrics provided in the route table (block 940). For example, in an implementation described above in connection with FIG. 4, network device 140-4 may receive advertisements 440-1, 440-2, and 440-3, and may populate route table 430 with the information included in advertisements 440-1, 440-2, and 440-3. Network device 140-4 may determine an optimal MME 150 to which to route a communication session of UE 110 based on connection request 450 and based on the metrics provided in route table 430. In one example, assuming a lower metric value indicates a more optimal MME 150, network device 140-4 may determine that MME 150-1 (e.g., associated with the next hop of "192.168.1.1"), which has a metric value of one (1), is the optimal MME 150 to which to route the communication session of UE 110.

Returning to FIG. 9, process 900 may include routing the UE to the particular network node, where the particular network node enables the UE to connect to the network (block 950). For example, in an implementation described above in connection with FIG. 4, based on the determination of the optimal MME 150, network device 140-4 may route the communication session of UE 110 to MME 150-1, as indicated by reference number 460. UE 110 may connect to MME 150-1, and MME 150-1 may enable UE 110 to connect to network 130 and receive services 470 from network 130. In one example, MME 150-1 may serve as a routed device, rather than a host node, so that loopback may be achieved.

Process block 940 may include the process blocks depicted in FIG. 10. As shown in FIG. 10, process block 940 may include determining loads associated with the network nodes (block 1000), determining distances associated with the network nodes (block 1010), and determining costs associated with the network nodes (block 1020). For example, in an implementation described above in connection with FIG. 4, network device 140-4 may include route table 430. Route table 430 may include a network address field, a next hop field, and a metric field. The network address field may include entries for loopback IP addresses associated with MMEs 150. The next hop field may include entries for physical interface IP addresses associated with MMEs 150. The metric field may include entries for metrics assigned to MMEs 150 associated with the physical interface IP addresses identified in the next hop field. The metrics may be influenced by the loads placed on MMEs 150, distances to MMEs 150, costs of connecting to MMEs 150, etc.

As further shown in FIG. 10, process block 940 may include calculating metrics for the network nodes based on the loads, the distances, and the costs (block 1030), providing the calculated metrics to the route table (block 1040), and selecting the particular network node based on the calculated metrics provided in the route table (block 1050). For example, in an implementation described above in connection with FIG. 8, first MME 150-1 may compute KPIs 810-1, such as an attach failure ratio, a handover failure ratio, latency, jitter, frame loss, bandwidth, a distance, a cost, etc., as well as raw statistics that determine a load on first MME 150-1. First MME 150-1 may utilize KPIs 810-1 and the raw statistics to compute metric value 840-1 associated with first MME 150-1, as indicated by reference number 820-1. A protocol process, such as OSPF process 830-1, may receive metric value 840-1 and may advertise metric value 840-1 to network device 140-1. An interior routing protocol may enable network devices 140 to provide metric values 840-1, 840-2, and 840-3 in a route table that may be used to automatically route to an optimal MME 150 at any particular point in time.

Process block 1000 may include the process blocks depicted in FIG. 11. As shown in FIG. 11, process block 1000 may include receiving the loads associated with the network nodes based on key performance indicators calculated by the network nodes (block 1100), and receiving the loads associated with the network nodes based on raw load statistics calculated by the network nodes (block 1110). For example, in an implementation described above in connection with FIG. 8, first MME 150-1 may compute KPIs 810-1, such as an attach failure ratio, a handover failure ratio, latency, jitter, frame loss, bandwidth, a distance, a cost, etc., as well as raw statistics that determine a load on first MME 150-1. First MME 150-1 may utilize KPIs 810-1 and the raw statistics to compute metric value 840-1 associated with first MME 150-1, as indicated by reference number 820-1. A protocol process, such as OSPF process 830-1, may receive metric value 840-1 and may advertise metric value 840-1 to network device 140-1.

Systems and/or methods described herein may provide for optimized selection of network nodes, such as LTE network nodes (e.g., a MME, a SGW, a PGW, etc.), using an integrated control and data plane approach. The systems and/or methods may leverage features in routing protocols, such as the OSPF protocol, the IS-IS protocol, and the EIGRP, that perform longest prefix matching and metrics to select optimal routes. Furthermore, the systems and/or methods may eliminate long latencies in the event of network node failures, may eliminate unequal load on network nodes, and may eliminate complex mappings and manual configurations. The systems and/or methods may automatically load balance among a pool of network nodes by incorporating factors related to load in routing metrics.

The foregoing description of implementations provides illustration and description, but is not intended to be exhaustive or to limit the implementations to the precise form disclosed. Modifications and variations are possible in light of the above teachings or may be acquired from practice of the implementations.

For example, while series of blocks have been described with regard to FIGS. 9-11, the order of the blocks may be modified in other implementations. Further, non-dependent blocks may be performed in parallel.

It will be apparent that example aspects, as described above, may be implemented in many different forms of software, firmware, and hardware in the implementations illustrated in the figures. The actual software code or specialized control hardware used to implement these aspects should not be construed as limiting. Thus, the operation and behavior of the aspects were described without reference to the specific software code--it being understood that software and control hardware could be designed to implement the aspects based on the description herein.

Even though particular combinations of features are recited in the claims and/or disclosed in the specification, these combinations are not intended to limit the disclosure of the invention. In fact, many of these features may be combined in ways not specifically recited in the claims and/or disclosed in the specification. Although each dependent claim listed below may directly depend on only one other claim, the disclosure of the invention includes each dependent claim in combination with every other claim in the claim set.

No element, act, or instruction used in the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A method, comprising:
   receiving, by the device, a common loopback Internet protocol (IP) address assigned to a group of network nodes of a network, physical interface IP addresses, each associated with one of the group of network nodes, and metrics, each associated with one of the group of network nodes, wherein the common loopback IP address is assigned to the group of network nodes, the group of network nodes are associated with tracking area codes (TACs), and each of the TACs identifies a corresponding tracking area;
   storing, by the device, the received common loopback IP address, the received physical interface IP addresses, and the received metrics in a route table, wherein the received physical interface IP addresses and the received metrics correspond to the received common loopback IP address in the route table;
   receiving, by the device and from user equipment, a request to connect to the network;
   determining, by the device, among the group of network nodes, a particular network node to which to forward a communication session of the user equipment, based on the received common loopback IP address;
   selecting, by the device, the particular network node based on the request and based on the metrics which correspond to the common loopback IP address and are stored in the route table; and
   routing, by the device, the communication session of the user equipment to the particular network node, wherein the particular network node enables the user equipment to connect to the network.

2. The method of claim 1, where the network nodes include long term evolution (LTE) network nodes.

3. The method of claim 2, where each of the LTE network nodes includes one of:
   a mobility management entity,
   a serving gateway, or
   a packet data network gateway.

4. The method of claim 1, where the metrics include information associated with one or more of:
   loads placed on the network nodes,
   distances between the network nodes, or
   costs of connecting the network nodes.

5. The method of claim 1, where selecting the particular network node further comprises:
   determining loads associated with the network nodes;
   determining distances between the network nodes;
   determining costs of connecting the network nodes;
   calculating the metrics for the network nodes based on the loads, the distances, and the costs;
   storing the calculated metrics to the route table; and
   selecting the particular network node based on the metrics calculated and stored in the route table.

6. The method of claim 5, where determining the loads associated with the network nodes further comprises:
   receiving loads associated with the network nodes based on key performance indicators calculated by the network nodes; and
   receiving loads associated with the network nodes based on raw statistics calculated by the network nodes.

7. A device, comprising:
   a memory to store a route table; and
   a processor to:
   receive a common loopback Internet protocol (IP) address assigned to a group of network nodes of a network and metrics, each associated with one of the group of network nodes, wherein the common loopback IP address is assigned to the group of network nodes, the group of network nodes are associated with tracking area codes (TACs), and each of the TACs identifies a corresponding tracking area,
   store the received common IP address and the received metrics in the route table, wherein the received metrics correspond to the received common loopback IP address in the route table,
   receive, from user equipment, a request to connect to the network,
   determine, among the group of network nodes, a particular network node to which to forward a communication session of the user equipment, based on the received common loopback IP address,
   select the particular network node, based on the request and based on the metrics which correspond to the common loopback IP address and are stored in the route table; and
   forward the communication session of the user equipment to the particular network node, wherein the particular network node enables the user equipment to connect to the network.

8. The device of claim 7, where the device comprises a network device provided in a long term evolution network.

9. The device of claim 7, where the network nodes include long term evolution (LTE) network nodes.

10. The device of claim 9, where each of the LTE network nodes includes one of:
a mobility management entity,
a serving gateway, or
a packet data network gateway.

11. The device of claim 7, where the metrics include information associated with one or more of:
loads placed on the network nodes,
distances between the network nodes, or
costs of connecting the network nodes.

12. The device of claim 7, where, when selecting the particular network node, the processor is further to:
select, as the particular network node, one of the network nodes with a load that is smaller than loads placed on other network nodes.

13. The device of claim 7, where, when selecting the particular network node, the processor is further to:
determine loads associated with the network nodes,
determine distances between the network nodes,
determine costs of connecting the network nodes,
calculate the metrics for the network nodes based on the loads, the distances, and the costs,
store the calculated metrics to the route table, and
select the particular network node based on the calculated metrics stored in the route table.

14. The device of claim 13, where, when determining the loads associated with the network nodes, the processor is further to:
receive loads associated with the network nodes based on key performance indicators calculated by the network nodes, and
receive loads associated with the network nodes based on raw statistics calculated by the network nodes.

15. A non-transitory computer-readable medium, comprising:
one or more instructions that, when executed by a processor, cause the processor to:
receive a common loopback Internet protocol (IP) address assigned to a group of network nodes of a network, physical interface IP addresses, each associated with one of the group of network nodes, and metrics, each associated with one of the group of network, wherein the common loopback IP address is assigned to the group of network nodes, the group of network nodes are associated with tracking area codes (TACs), and each of the TACs identifies a corresponding tracking area,
store the received common loopback IP address, the received physical interface IP addresses, and the received metrics in a route table, wherein the received physical interface IP addresses and the received metrics correspond to the received common loopback IP address in the route table,
receive, from user equipment, a request to connect to the network,
determine, among the group of network nodes, a particular network node to which to forward a communication session of the user equipment, based on the received common loopback IP address,
select the particular network node, based on the request and based on the metrics which correspond to the common loopback IP address and are stored in the route table, and
route the communication session of the user equipment to the particular network node, wherein the particular network node enables the user equipment to connect to the network.

16. The non-transitory computer-readable medium of claim 15, where the network nodes include long term evolution (LTE) network nodes.

17. The non-transitory computer-readable medium of claim 16, where each of the LTE network nodes includes one of:
a mobility management entity,
a serving gateway, or
a packet data network gateway.

18. The non-transitory computer-readable medium of claim 15, where the metrics include information associated with one or more of:
loads placed on the network nodes,
distances between the network nodes, or
costs connecting the network nodes.

19. The non-transitory computer-readable medium of claim 15, further comprising:
one or more instructions that, when executed by the processor, cause the processor to:
determine loads associated with the network nodes,
determine distances between the network nodes,
determine costs connecting the network nodes,
calculate the metrics for the network nodes based on the loads, the distances, and the costs,
store the calculated metrics to the route table, and
select the particular network node based on the calculated metrics stored in the route table.

20. The non-transitory computer-readable medium of claim 19, where the loads associated with the network nodes are determined based on key performance indicators and raw statistics calculated by the network nodes.

* * * * *